United States Patent [19]
Kusakabe

[11] Patent Number: 5,198,781
[45] Date of Patent: Mar. 30, 1993

[54] CUSTOM INTEGRATED CIRCUIT COMPOSED OF A COMBINATION OF ANALOG CIRCUIT CELLS DESIGNED TO OPERATE IN CURRENT MODE

[75] Inventor: Hiromi Kusakabe, Yokohama, Japan

[73] Assignee: Kabushiki Kaisha Toshiba, Kawasaki, Japan

[21] Appl. No.: 731,329

[22] Filed: Jul. 17, 1991

[30] Foreign Application Priority Data

Jul. 19, 1990 [JP] Japan ............................ 2-189531

[51] Int. Cl.⁵ ............................................ H03F 3/45
[52] U.S. Cl. ................................. 330/257; 330/310
[58] Field of Search ............... 330/257, 288, 307, 310

[56] References Cited
U.S. PATENT DOCUMENTS

| | | | |
|---|---|---|---|
| 3,509,364 | 4/1970 | Buckley | 330/307 X |
| 3,671,877 | 6/1972 | Van Den Plassche | |
| 3,931,583 | 1/1976 | Gilbert | 330/257 |
| 4,529,946 | 7/1985 | Kusakabe | 330/257 |
| 4,641,108 | 2/1987 | Gill, Jr. | 330/307 |
| 4,987,380 | 1/1991 | Ishikawa | 330/257 X |

FOREIGN PATENT DOCUMENTS 53-25230  7/1978  Japan .
54-24259  8/1979  Japan .

Primary Examiner—James B. Mullins
Attorney, Agent, or Firm—Oblon, Spivak, McClelland, Maier & Neustadt

[57] ABSTRACT

A circuit constituting a system or a subsystem is composed of a cascade connection of a plurality of analog circuit cells. At least one of said analog circuit cells has either the current-sink input terminal and a current-source output terminal or a current-source input terminal and current-sink output terminal and operates in the current mode.

6 Claims, 11 Drawing Sheets

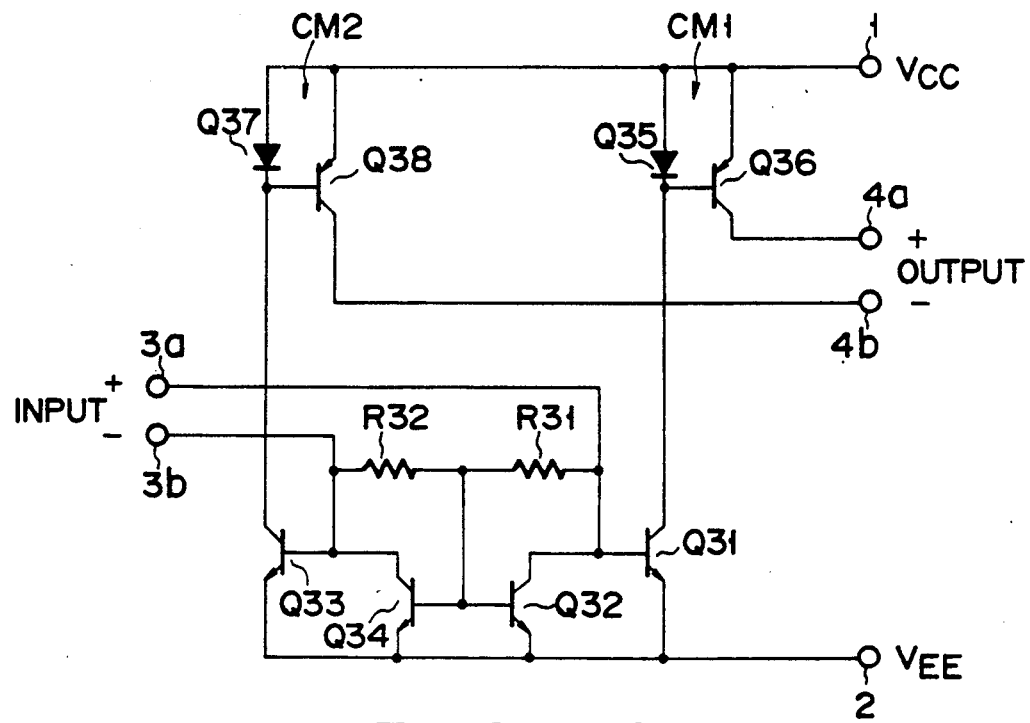
F I G. 4
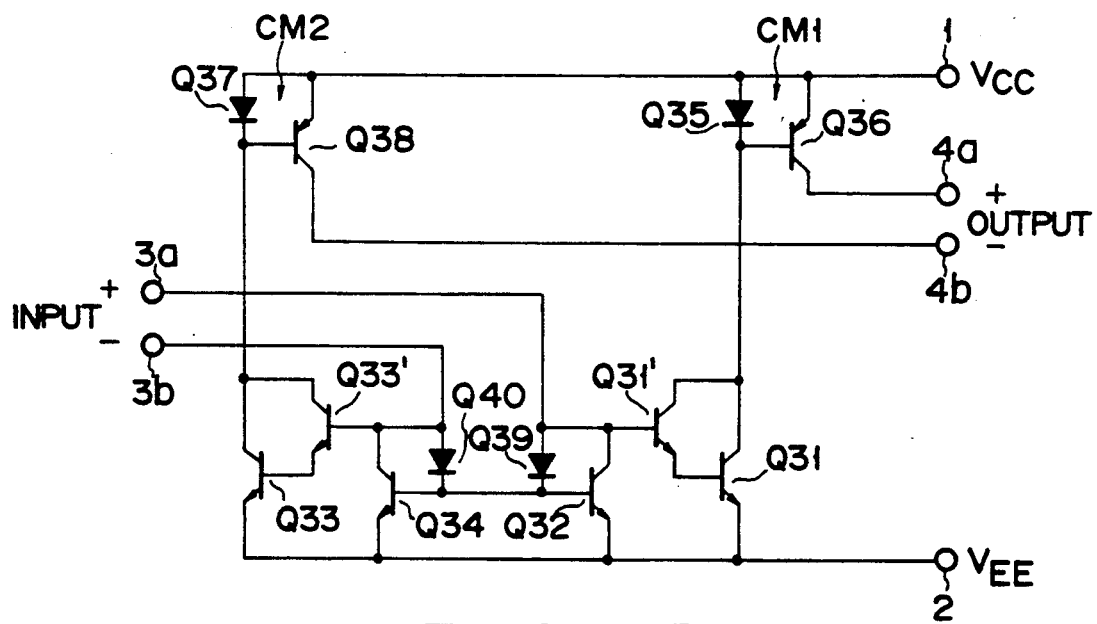
F I G. 5

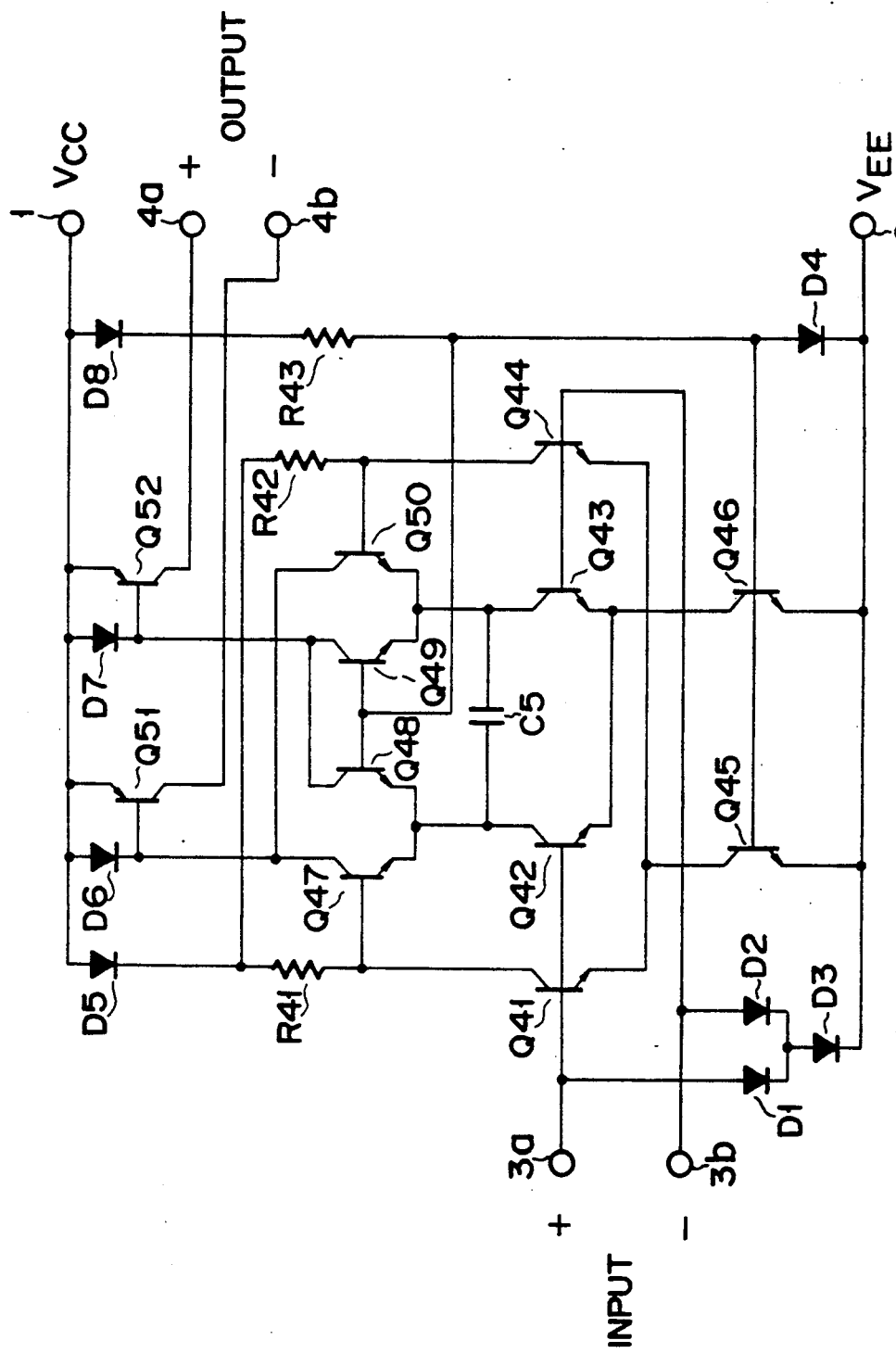
F I G. 6

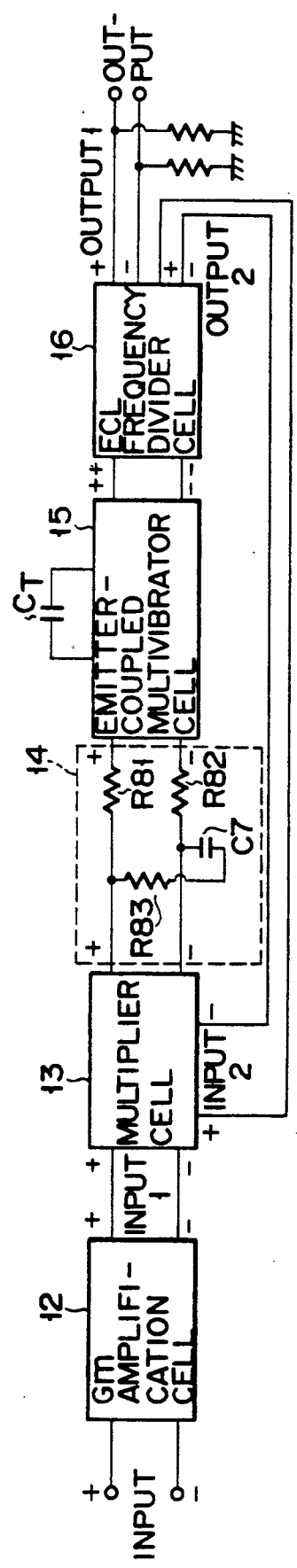
F I G. 13

CUSTOM INTEGRATED CIRCUIT COMPOSED OF A COMBINATION OF ANALOG CIRCUIT CELLS DESIGNED TO OPERATE IN CURRENT MODE

BACKGROUND OF THE INVENTION

1. Field of the Invention

This invention relates to a semiconductor integrated circuit, and more particularly to a custom integrated circuit composed of a combination of analog circuit cells designed to operate in the current mode.

2. Description of the Related Art

One known technique for realizing a custom integrated circuit is to form a plurality of analog circuit cells in the same semiconductor substrate and then combine these analog circuit cells into a system or a subsystem. FIG. 1 shows a conventional intermediate-frequency amplifier cell as an example of an analog circuit cell constituting a custom integrated circuit of this type. This cell, which operates from the voltages of the power supplies $V_{CC}$ and $V_{EE}$ applied across power supply terminals 1 and 2, is composed of a cascade connection of differential amplifiers DA-1, DA-2, and DA-3, and an emitter follower circuit EF. These differential amplifiers DA-1, DA-2, and DA-3, and an emitter follower circuit EF each operate receiving the bias voltage from the bias circuit BA. The differential amplifier DA-1 essentially consists of n-p-n transistors Q1 through Q4, Q15 through Q17, and resistors R1 through R4, with the input nodes (the bases of transistors Q1 and Q4) connected to the input terminals 3a and 3b, respectively. The differential amplifier DA-2 essentially consists of n-p-n transistors Q5 through Q8, Q18 through Q20, and resistors R5 through R8. The output nodes (the collectors of transistors Q3 and Q2) of the differential amplifier DA-1 are coupled through capacitors C1 and C2 with the input nodes (the bases of transistors Q5 and Q8) of the differential amplifier DA-2, respectively. The differential amplifier DA-3 essentially consists of n-p-n transistors Q9 through Q12, Q21 through Q23, and resistors R9 through R12. The output nodes (the collectors of transistors Q7 and Q6) of the differential amplifier DA-2 are coupled through capacitors C3 and C4 with the input nodes (the bases of transistors Q9 and Q12) of the differential amplifier DA-3, respectively. The emitter follower circuit EF is composed of n-p-n transistors Q13, Q14, Q24, and Q25. The output nodes (the collectors of transistors Q11 and Q10) of the differential amplifier DA-3 are connected to the bases of transistors Q13 and Q14, respectively. The emitters of the transistors Q13 and Q14 are connected to the output terminals 4a and 4b, respectively. The bias circuit BA, which is made up of n-p-n transistors Q26 and Q27, supplies to the base of each of transistors Q15 through Q25 a current corresponding to the bias voltage applied to the bias terminal 5.

The differential input signal supplied to the input terminals 3a and 3b are amplified at the differential amplifiers DA-1, DA-2, and DA-3 in that order. The output signals from the differential amplifier DA-3 are supplied at the output terminals 4a and 4b via the emitter follower circuit EF.

In the intermediate-frequency amplifier cell with such an arrangement, the input terminal 3a is biased by the power supply $V_{CC}$ via the resistor R1 and, the input terminal 3b via the resistor R4. For this reason, this cell must be basically capacitor-coupled with the preceding-stage circuit (not shown). The potential of the output terminal 4a is fixed at the potential equal to the power supply $V_{CC}$ minus the sum of the voltage drop (several hundred mV) across the resistor R11 and the base-emitter voltage $V_{BE}$ of the n-p-n transistor Q13, whereas the potential of the output terminal 4b is fixed at the potential equal to the power supply $V_{CC}$ minus the sum of the voltage drop (several hundred mV) across the resistor R10 and the base-emitter voltage $V_{BE}$ of the n-p-n transistor Q14. Therefore, it is necessary to set the input terminal potentials of the subsequentstage analog circuit cell (not shown) to be connected at the potentials of the output terminals 4a and 4b. It is also necessary to externally supply as much direct current as required to the bias terminal 5 needed to determine the bias voltage of the circuit.

As noted above, the input, output, bias circuits, and the like in conventional analog circuit cells are each based on unique design concepts, so that individual cells are different from each other in various conditions including voltage, current, and impedance required to provide the desired supply voltages and biases. For this reason, when a plurality of analog circuit cells are combined into a system or a subsystem to constitute a custom integrated circuit, the potentials of the input and output terminals are restricted to particular values and their alternating-current impedance matching is required, which makes the interface complex. To fulfill these complicated connecting conditions, detailed technical evaluations and partial circuit modifications are necessary, resulting in poor versatility.

SUMMARY OF THE INVENTION

Accordingly, an object of the present invention is to provide a semiconductor integrated circuit that, like digital circuits, allows connection without requiring attention to the interface conditions, making it almost unnecessary to match the supply voltages and troublesome bias conditions, when a custom integrated circuit is realized by combining analog circuit cells into a system or subsystem.

Another object of the present invention is to provide a semiconductor integrated circuit containing highly versatile analog circuit cells best suited to form a custom integrated circuit.

A further object of the present invention is to provide a custom integrated circuit enabling circuit design by simple techniques in a short period of time, which is particularly suited to realize various types of integrated circuits with short delivery time and large-scale integrated circuits.

The foregoing objects are accomplished by a semiconductor integrated circuit comprising either a system or a subsystem that is constructed by combining a plurality of analog circuit cells, wherein at least one of the analog circuit cells has a current-sink input terminal and a current-source out-put terminal or the current-source input terminal and a current-sink output terminal and operates in the current mode.

Since an analog circuit cell is used which operates in the current mode and basically has an input impedance of zero and an output impedance of infinity, bias potentials have no effect on the combination of multiple stages of analog circuit cells, which makes the setting of supply voltage relatively free. The lower input impedance produces a smaller signal voltage at the connection with other circuit blocks, resulting in less interference with the other circuit blocks.

Therefore, in realizing a custom integrated circuit by combining analog circuit cells to form a system or a subsystem, those cells can be connected without requiring attention to the interface conditions like digital circuits, making it almost unnecessary to match the supply voltages and troublesome bias conditions. The analog circuit cell that operates in the current mode is easy to interface, which makes it unnecessary to examine detailed technical requirements and modify part of the circuit, resulting in high versatility. This feature is very useful in forming a custom integrated circuit. Particularly, such high versatility enables circuit design by simple techniques in a short period of time, which is best suited to realize various types of integrated circuits with short delivery time or largescale integrated circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram for an overdrive amplifier cell as an example of an analog circuit cell used in a custom integrated circuit according to an embodiment of the present invention;

FIG. 5 is a circuit diagram for a rectifier cell as an example of an analog circuit cell used in a custom integrated circuit according to an embodiment of the present invention;

FIG. 6 is a circuit diagram for a pulse-count FM detector cell as an example of an analog circuit cell used in a custom integrated circuit according to an embodiment of the present invention;

FIG. 13 is a circuit diagram for a PLL multiplication circuit cell as an example of a system composed of analog circuit cells according to the present invention.

DETAILED DESCRIPTION OF THE PREFERRED EMBODIMENTS

A custom integrated circuit according to this invention comprises a system or subsystem formed by combining a plurality of analog circuit cells. At least one of the analog circuit cells has the current-sink input terminal and a current-source out-put terminal or the current-source input terminal and a current-sink output terminal and operates in the current mode.

A current amplifier cell, which is the most basic analog circuit cell with the function of operating in the current mode, will be explained, referring to the equivalent circuit of FIG. 2.

In the current amplifier cell, the input terminals $3a$ and $3b$ are of the differential input type of $(+)$ and $(-)$ and its input impedance is set low, taking into account the current input. Batteries 10-1 and 10-2 are connected between the input terminals $3a$ and $3b$ and the earth point, respectively. An ideal input impedance is zero. Theoretically, the direct-current potential of the input can take any value, but actually, it is preferable to set the potential to the same ($1V_{BE}$) as or twice ($2V_{BE}$) the base-emitter voltage $V_{BE}$ of the transistor. The output terminals $4a$ and $4b$ are of the differential output type of $(+)$ and $(-)$ and its output impedance is theoretically infinite. The current amplifier cell is designed so that the differential current input ma be amplified with a suitable amplification factor, and then supplied from the current sources 11-1 and 11-2 via the output terminals $4a$ and $4b$ to the outside world as differential currents.

Figure 1:
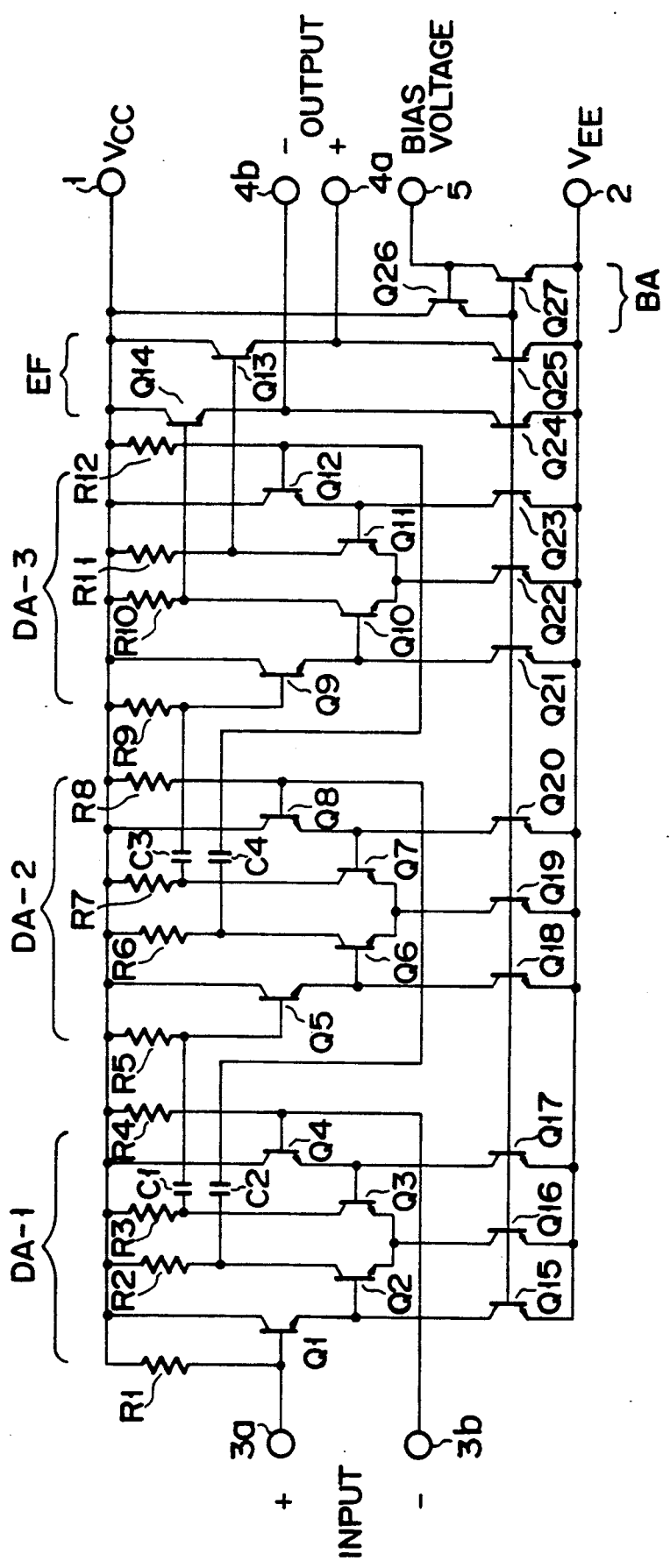
FIG. 1 is a circuit diagram for an intermediate frequency amplifier cell as an example of an analog circuit cell used in a conventional custom integrated circuit.
Figure 2:
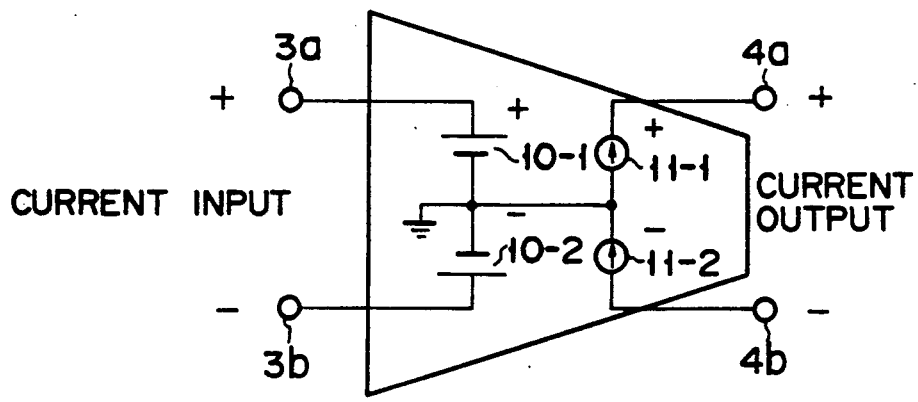
FIG. 2 is an equivalent circuit diagram for a current amplifier cell as a basic example of an analog circuit cell for the purpose of explaining embodiments of the present invention.

In the case of a two-stage cascade connection of current amplifier cells of FIG. 2, the output terminals of the first-stage current amplifier cell ar connected directly to the input terminals of the second-stage current amplifier cell. Because the output of the first-stage cell is a current output, its potential can be set to any value, which makes it possible to send the signal to any potential point in the second-stage cell (the voltages of batteries 10-1 and 10-2, in this case) without any problem. Although the current signal is sent correctly, the zero impedance completely prevents the signal voltage from appearing. This feature is useful in eliminating unwanted leakage of the signal from the input/output connection line to other circuit blocks.

When other functions such as rectification or multiplication other than amplification are added to the aforementioned analog circuit cell having the current input terminal of low impedance (ideally zero) and the current output terminal of high impedance (ideally infinite), the resulting cell inherits the above-described features as they are. The supply voltage of each analog circuit cell can be set to any value provided that it is within the dynamic output range of each cell. To put it in another way, it is possible to set a different supply voltage for each analog circuit cell. Signal exchange using differential current makes it much less susceptible to noises and interference from the power supply and ground lines.

As described above, by using an analog circuit cell that operates in the current mode basically with the input impedance zero and the output impedance infinitely large, a cascade connection, for example, of a plurality of analog circuit cells is not restricted by the bias potentials, making the setting of the supply voltage relatively free. In addition, there is the advantage that the lower input impedance produces a smaller signal voltage at the connection with other analog circuit cells (or other circuit blocks), decreasing interference with those cells (or those blocks).

Various practical circuit arrangements of analog circuit cells used in a custom integrated circuit according to the present invention will be described in detail, referring to FIGS. 3 through 12.

Figure 3:
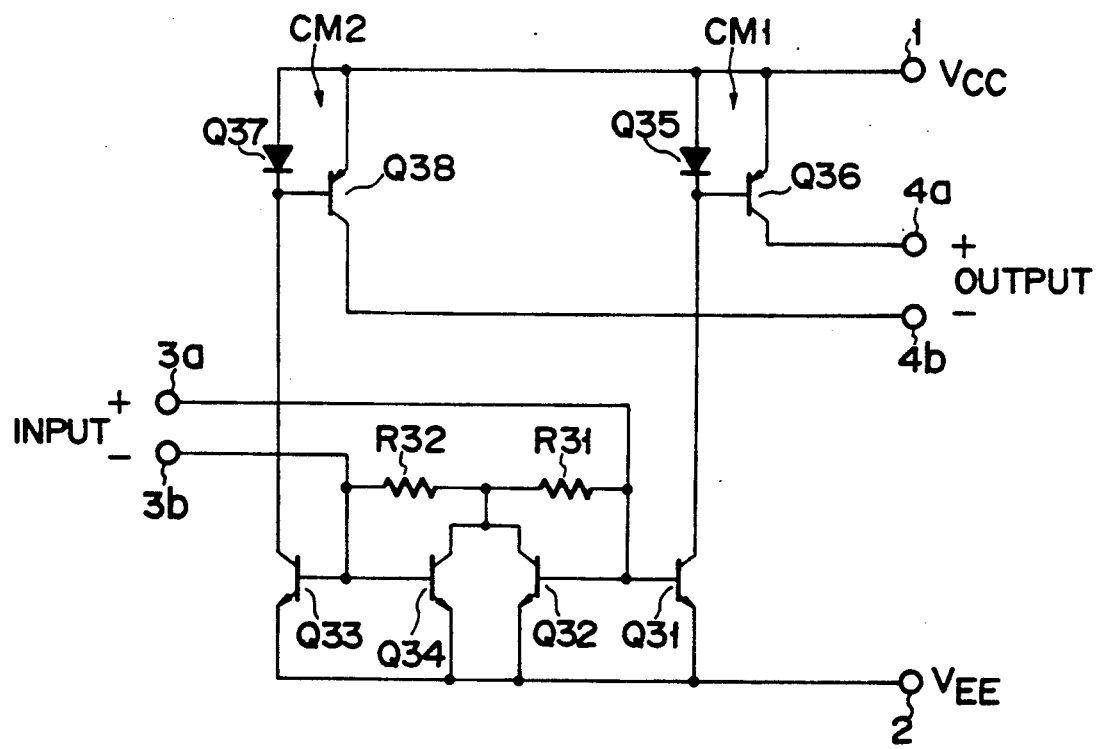
FIG. 3 is a circuit diagram for an amplitude-limiting amplifier cell as an example of an analog circuit cell used in a custom integrated circuit according to an embodiment of the present invention.

FIG. 3 shows an example of the current amplifier cell of FIG. 2 constructed so as to have a current-sink input terminal and a current-source output terminal. The input terminal 3a is connected to the bases of n-p-n transistors Q31 and Q32, while the input terminal 3b is connected to the bases of n-p-n transistors Q33 and Q34. The emitter of each of transistors Q31 through Q34 is connected to the power supply terminal 2 to which the power supply $V_{EE}$ is applied. The collectors of transistors Q32 and Q34 are connected to each other. A resistor R31 is connected between the base and collector of transistor Q32, whereas a resistor R32 is connected between the base and collector of transistor Q34. The collector of transistor Q31 is connected to the cathode of diode Q35 and the base of p-n-p transistor Q36, while the collector of transistor Q33 is connected to the cathode of diode Q37 and the base of p-n-p transistor Q38. The emitters of transistors Q36 and Q38 and the anodes of diodes Q35 and Q37 are each connected to the power supply terminal 1 to which the supply voltage $V_{CC}$ is applied. The collector of transistor Q36 is connected to the output terminal 4a, whereas the collector of transistor Q3 is connected to the output terminal 4b.

Each of the diodes Q35 and Q37 is connected between the base and emitter of a p-n-p transistor. The diode Q35 and transistor Q36 constitutes a current mirror circuit CM1, and similarly the diode Q37 and transistor Q38 makes up a current mirror circuit CM2. The diode-connected transistor Q35 acts as the collector load of transistor Q31, while the diode-connected transistor Q37 serves as the collector load of transistor Q33.

In the current amplifier cell with the above arrangement, the direct-current potential of the input is equal to the base-emitter voltage $V_{BE}$ of a single n-p-n transistor, so that the output current is turned back at the current mirror circuits CM1 and CM2. The differential current gain Gi is given as:

$$Gi = I \cdot R / V_T$$

where I is the common mode direct-current bias current, $V_T$ the thermal voltage, and R the load resistance. The common mode current gain is represented as 1. Transistors Q32 and Q34 have their emitters connected to the power supply $V_{EE}$, and their collectors to the connecting point of a pair of resistors R31 and R32 having the same resistance, with the common mode current I being considered as constant. Therefore, the current flowing through the collector-emitter path of a pair of transistors Q32 and Q34 is constant, so that a differential current $\Delta i$ passes through a pair of resistors R31 and R32, causing a voltage of $2R \cdot \Delta i$ (where R is the resistance of resistors R31 and R32) between the bases of a pair of n-p-n transistors Q32 and Q34. As a result, a balance between a pair of transistors Q32 and Q34 is lost, causing only the differential component to be amplified. It should be noted that during such an action, the common mode current component remains unchanged, causing the total of the operating currents to remain unchanged. Therefore, the differential current $\Delta i$ cannot exceed the common mode current I, which permits a limiter action to take place, thereby clipping the input with a large amplitude. Accordingly, the current amplifier cell has an amplitude-limiting function.

FIG. 4 shows an example of the current amplifier cell of FIG. 2 constructed so as to have an overdrive function as well as a current-sink input terminal and a current-source output terminal. The difference between the current amplifier cells of FIGS. 4 and 3 is the way of connecting transistors Q32 and Q34 with related circuits. That is, the transistor Q32 has its collector connected to the base of transistor Q31, the input terminal 3a, and one end of resistor R31, its emitter to the power supply terminal 2, and its base to the connecting point of resistors R31 and R32. The transistor Q34 has its collector connected to the base of transistor Q33, the input terminal 3b, and one end of resistor R32, its emitter to the power supply terminal 2, and its base to the connecting point of resistors R31 and R32.

In the current amplifier cell, if the common mode current I is entering the input terminals 3a and 3b with the differential current $\Delta i = 0$, the common mode current I appears as it is at the output terminals 4a and 4b under ideal conditions (that is, the transistor's current amplification factor $\beta = \infty$). In this situation, when a differential input is received, a voltage of "$+R \cdot \Delta i$" appears at the base of transistor Q31 while a voltage of "$-R \cdot \Delta i$" appears at the base of transistor Q33. As a result, because of the nonlinear characteristics of the mutual conductance Gm (=output current/input voltage) of each of transistors Q31 and Q33, the increasing input is overdriven, which makes it difficult to clip too large input signals when they are increasing.

A detailed description of the differential amplifying section i the current amplifier cell of FIG. 4 is given in Published Unexamined Japanese Patent Application No. 48-27664, "Differential amplifier."

FIG. 5 shows an arrangement of a rectifier cell having a current-sink input terminal and a current-source output terminal. The rectifier cell is constructed by adding n-p-n transistors Q31' and Q33' to the current amplifier cell of FIG. 3 with diode-connected n-p-n transistors (or diodes only) Q39 and Q40 replacing the resistors R31 and R32. The transistor Q31' is connected to the transistor Q31 to form a Darlington circuit, while the transistor Q33' is connected to the transistor Q33 to form another Darlington circuit. The diode Q39 has its anode connected to the input terminal 3a, the base of the transistor Q31', and the collector of transistor Q32, and its cathode to the bases of transistors Q32 and Q34. The diode Q40 has its anode connected to the input terminal 3b, the base of transistor Q33', and the collector of transistor Q34, and its cathode to the bases of transistors Q34 and Q32. The remaining configuration is the same as that of the circuit of FIG. 3.

With this rectifier cell, the two transistors Q31' and Q33' are driven alternately every half cycle of the differential input current. The current flowing through the collector-emitter path of transistor Q31 is turned back at the current mirror circuit CM1 (in other words, the same current as that flowing through the collector-emitter path of transistor Q31 flows through the emitter-collector path of transistor Q36), whereas the current flowing through the collector-emitter path of transistor Q3 is turned back at the current mirror circuit CM2 (that is, the same current as that flowing through the collector-emitter path of transistor Q33 flows through the emitter-collector path of transistor Q38). As a result, the positive and negative halfwave-rectified current outputs appear at the output terminals 4a and 4b, respectively. When a full-wave rectified output is desired, it is obtained by simply connecting the output terminals 4a and 4b to one another.

FIG. 6 shows an arrangement of a pulse-count FM (frequency modulation) detector cell having a current-sink input terminal and a current-source output terminal. The pulse-count FM detector cell is constructed by adding a current folded circuit, which is composed of diodes D1 through D3 (or diode-connected transistors), between the power supply $V_{EE}$ and the input terminal pair of the doubly-balanced circuit in an ordinary voltage-input pulse-count FM detector cell. That is, the input terminal 3a is connected to the bases of n-p-n transistors Q41 and Q42 and the anode of diode D1, whereas the input terminal 3b is connected to the bases of n-p-n transistors Q43 and Q44 and the anode of diode D2. The cathodes of diodes D1 and D2 are connected to the anode of diode D3, whose cathode is connected to the power supply terminal 2 to which the supply voltage $V_{EE}$ is applied. The emitters of transistors Q41 and Q44 are connected together and this connecting point is connected to the collector of n-p-n transistor Q45. The emitters of transistors Q42 and Q43 are connected together and this connecting point is connected to the collector of n-p-n transistor Q46. The emitters of transistors Q45 and Q46 are connected to the power supply terminal 2. The collector of transistor Q41 is connected to one end of resistor R41 and the base of n-p-n transistor Q47. The collector of transistor Q42 is connected to the emitters of n-p-n transistors Q47 and Q48. The collector of transistor Q43 is connected to the emitters of n-p-n transistors Q49 and Q50. The collector of transistor Q4 is connected to the base of transistor Q50 and one end of resistor R42. A capacitor C5 is connected between the collectors of transistors Q42 and Q43. The other ends of resistors R41 and R42 are connected to the cathode of diode D5, whose anode is connected to the power supply terminal 1 to which the supply voltage $V_{CC}$ is applied. The collectors of transistor Q47 and Q50 are connected to the cathode of diode D6 and the base of transistor Q51, with the anode of diode D6 connected to the power supply terminal 1. The collectors of transistor Q48 and Q49 are connected to the cathode of diode D7 and the base of transistor Q52, with the anode of diode D7 connected to the power supply terminal 1. The emitters of transistors Q51 and Q52 are connected to the power supply terminal 1, while the collector of transistor Q52 and the collector of transistor Q51 are connected to the output terminals 4a and 4b, respectively. The power supply terminal 1 is connected to the anode of diode D8, whose cathode is connected to one end of resistor R43, the other end of which is connected to the bases of transistors Q48 and Q49, the bases of transistors Q45 and Q46, and the anode of diode D4. The cathode of diode D4 is connected to the power supply terminal 2.

With this pulse-count FM detector cell, in response to the FM pulse train received at the input terminals 3a and 3b, the capacitor C5 is charged and discharged which is connected between the collectors of the differential amplifier on the current-source side (on the lower side in the figure) in the doubly-balanced circuit. At the output terminals 4a and 4b, a PWM (pulse-width modulation) wave containing demodulated sound signals appear as the current output.

Figure 7:
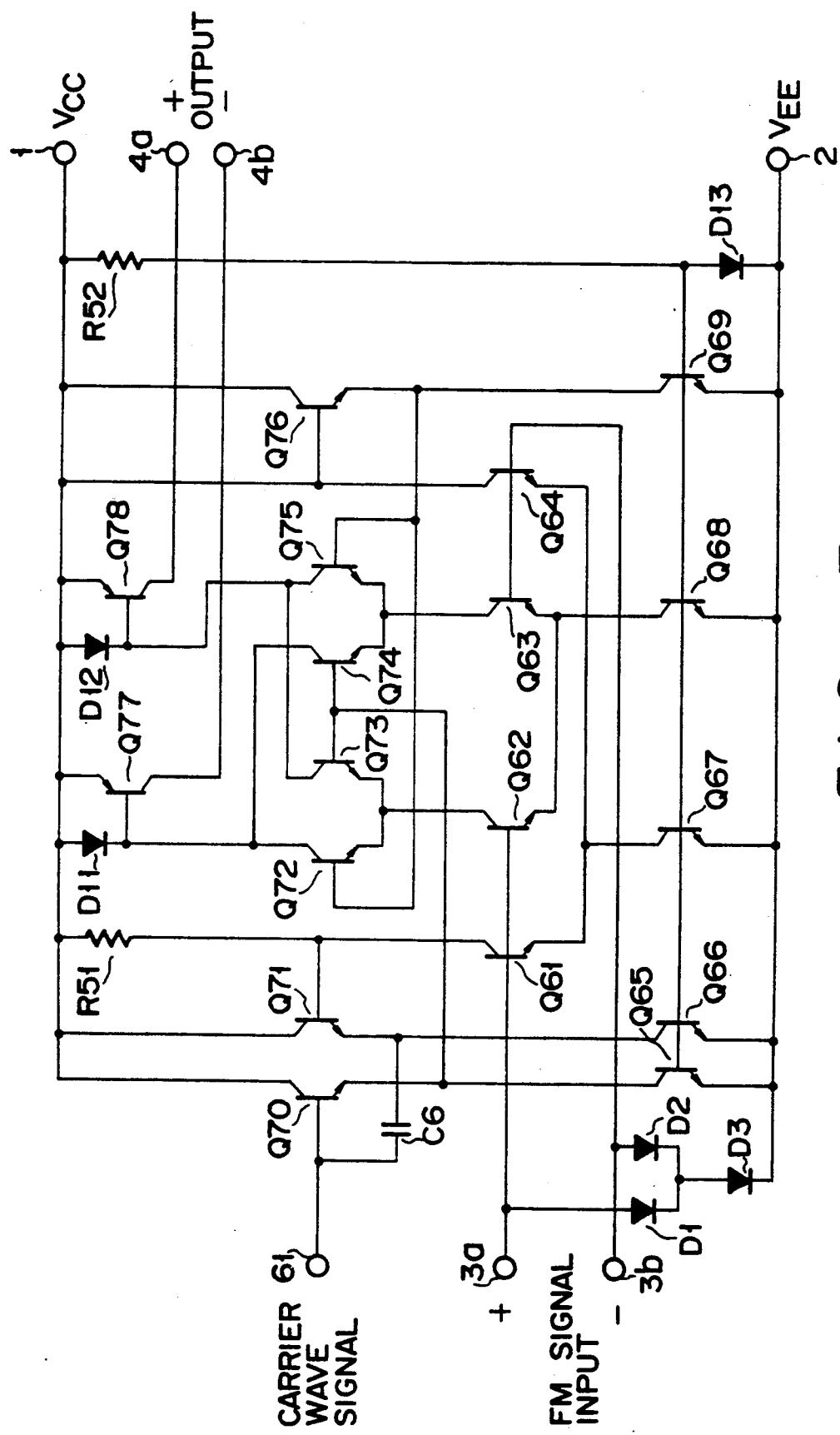
FIG. 7 is a circuit diagram for a quadrature FM detector cell as an example of an analog circuit cell used in a custom integrated circuit according to an embodiment of the present invention.

FIG. 7 illustrates a configuration of an FM quadrature detector cell having a current-sink input terminal and a current-source output terminal. The FM quadrature detector cell is constructed by adding a current folded circuit, which is composed of diodes D1 through D3, between the power supply $V_{EE}$ and the FM-signal input terminals 3a and 3b of the doubly-balanced circuit in an ordinary voltage-input pulse-count FM quadrature detector cell. The input terminal 3a is connected to the bases of n-p-n transistors Q61 and Q62 and the anode of diode D1, whereas the input terminal 3b is connected to the bases of n-p-n transistors Q63 and Q64 and the anode of diode D2. The cathodes of diodes D1 and D2 are connected to the anode of diode D3, whose cathode is connected to the power supply terminal 2 to which the supply voltage $V_{EE}$ is applied. The emitters of transistors Q61 and Q64 are connected together and this connecting point is connected to the collector of n-p-n transistor Q67. The emitters of transistors Q62 and Q63 are connected together and this connecting point is connected to the collector of n-p-n transistor Q68. The emitters of transistors Q67 and Q68 are connected to the power supply terminal 2. The collector of transistor Q61 is connected to one end of resistor R51 and the base of n-p-n transistor Q71. The collector of transistor Q62 is connected to the emitters of n-p-n transistors Q72 and Q73. The collector of transistor Q63 is connected to the emitters of n-p-n transistors Q74 and Q75. The collector of transistor Q64 is connected to the base of transistor Q76 and the power supply terminal 1 to which the supply voltage $V_{CC}$ is applied. The collectors of transistors Q72 and Q74 are connected to the cathode of diode D11 and the base of p-n-p transistor Q77, with the anode of diode D11 connected to the power supply terminal 1. The collectors of transistors Q73 and Q75 are connected to the cathode of diode D12 and the base of p-n-p transistor Q78, with the anode of diode D12 connected to the power supply 1. The emitters of transistors Q77 and Q78 are connected to the power supply terminal 1, while the collector of transistor Q78 and the collector of transistor Q77 are connected to the output terminals 4a and 4b, respectively. The transistor Q76 has its collector connected to the power supply terminal 1 and its emitter to the bases of transistors Q72 and Q75 and the collector of transistor Q69. The base of transistor Q69 is connected to the bases of transistors Q65 through Q68, one end of resistor R52, and the anode of diode D13. The other end of resistor R52 is connected to the power supply terminal 1 and the cathode of diode D13 to the power supply terminal 2. The transistor Q71 has its collector connected to the power supply terminal 1 and its emitter to the collector of transistor Q66. The output terminal 61 of phase-shifting circuit is connected to the base of transistor Q70. A capacitor C6 is connected between the terminal 61 and the emitter of transistor Q71. The transistor Q70 has its collector connected to the power supply terminal 1 and its emitter to the bases of transistors Q73 and Q74, and the collector of transistor Q65. The emitters of transistors Q65 and Q66 are connected to the power supply terminal 2.

With this FM quadrature detector cell, the differential amplifier on the current-source side (on the lower side in the figure) of the doubly-balanced circuit is supplied with the frequency-modulated input current as it is via the FM signal input terminals 3a and 3b, while the differential amplifier on the multiplication side (on the upper side in the figure) is supplied with the carrier wave signal phase-shifted by an external phase-shifting circuit (not shown), which is connected to the terminal 61, via the capacitor C6. As a result, the PWM current output containing demodulated sound signals appears at the output terminals 4a and 4b.

Figure 8:
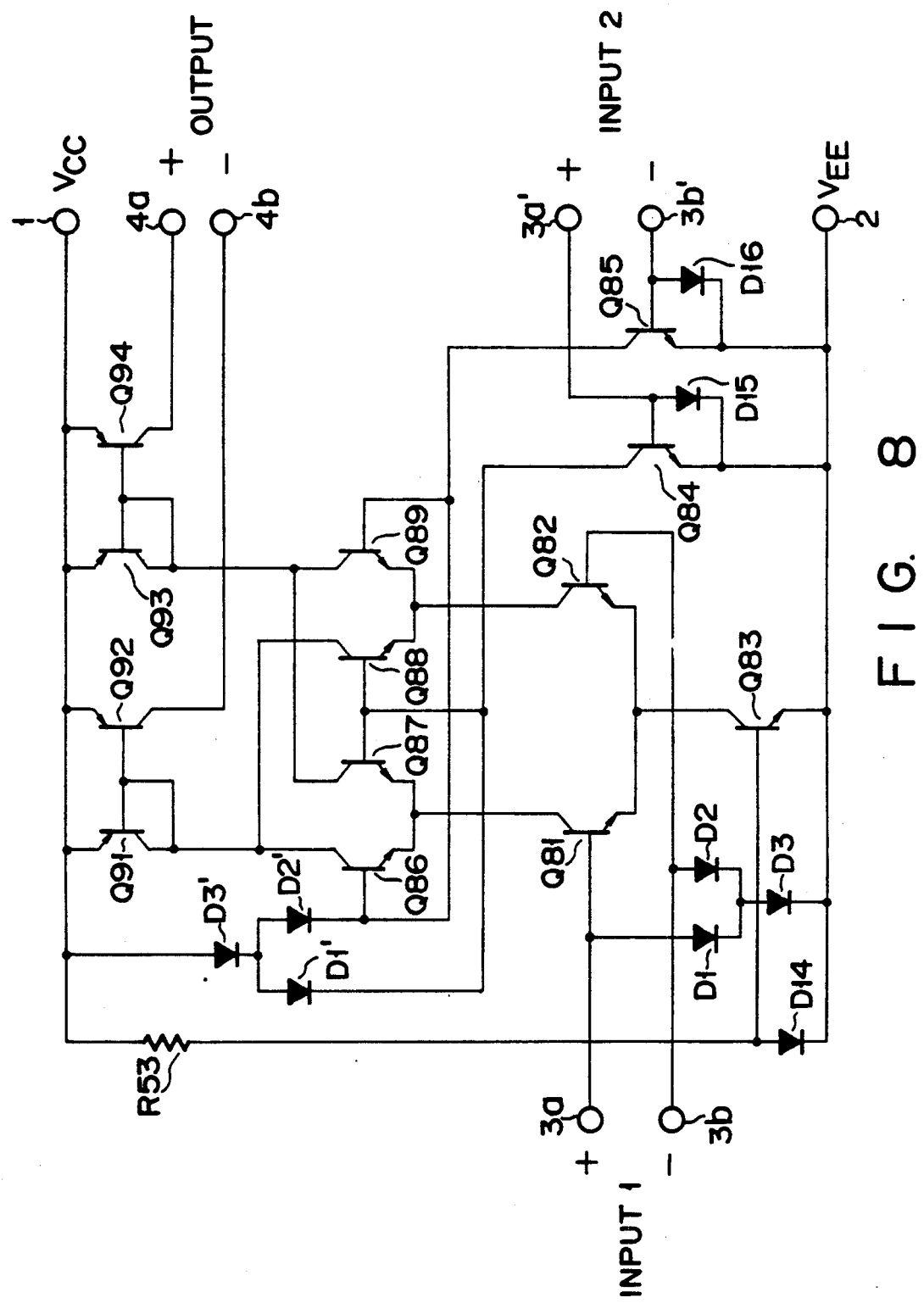
FIG. 8 is a circuit diagram for a multiplier cell as an example of an analog circuit cell used in a custom integrated circuit according to an embodiment of the present invention.

FIG. 8 illustrates a configuration of a multiplier cell having a current-sink input terminal and a current-source output terminal. The multiplier cell has a first current folded circuit, which is made up of diodes D1 through D3, added between the power supply $V_{EE}$ and the input terminals 3a and 3b of a first circuit system connected to the differential amplifier on the current-source side (on the lower side in the figure) of the doubly-balanced circuit in an ordinary voltage-input multiplier cell. Similarly, a second current folded circuit, which is composed of diodes D1' through D3', is added between the power supply $V_{CC}$ and the input node of the differential amplifier on the multiplication side (on the upper side in the figure). The input terminal 3a is connected to the base of n-p-n transistors Q81 and the anode of diode D1, whereas the input terminal 3b is connected to the base of n-p-n transistors Q82 and the anode of diode D2. The cathodes of diodes D1 and D2 are connected to the anode of diode D3, whose cathode is connected to the power supply terminal 2 to which the supply voltage $V_{EE}$ is applied. The emitters of transistors Q81 and Q82 are connected together and this connecting point is connected to the collector of n-p-n transistor Q83. The base of transistor Q83 is connected to one end of resistor R53 and the anode of diode D14. The other end of resistor R53 is connected to the power supply terminal 1 and the cathode of diode D14 to the power supply terminal 2. The collector of transistor Q81 is connected to the emitters of n-p-n transistors Q86 and Q87, while the collector of transistor Q82 is connected to the emitters of n-p-n transistors Q88 and Q89. The collectors of transistors Q86 and Q88 are connected to the collector and base of p-n-p transistor Q91 and the base of p-n-p transistor Q92. The collectors of transistors Q87 and Q89 are connected to the collector and base of p-n-p transistor Q93 and the base of p-n-p transistor Q94. The emitters of transistors Q91 and Q92 are connected to the power supply terminal 1, whereas the collector of transistor Q92 is connected to the out-put terminal 4b. The emitters of transistors Q93 and Q94 are connected to the power supply terminal 1, while the collector of transistor Q94 is connected to the out-put terminal 4a.

The input terminals 3a' and 3b' of the second circuit system are connected to the bases of n-p-n transistors Q84 and Q85, respectively. The emitters of transistors Q84 and Q85 are connected to the power supply terminal 2. The base and emitter of transistor Q84 are connected to the anode and cathode of diode D15, respectively, whereas the base and emitter of transistor Q85 are connected to the anode and cathode of diode D16, respectively. The collector of transistor Q84 is connected to the bases of transistors Q87 and Q88 and the cathode of diode D1', while the collector of transistor Q85 is connected to the bases of transistors Q86 and Q89 and the cathode of diode D2'. The anodes of diodes D1' and D2' are connected to the cathode of diode D3', whose anode is connected to the power supply terminal 1.

With this multiplier cell, the inputs for the two systems are supplied to the differential amplifier on the current-source side (on the lower side in the figure) and the differential amplifier on the multiplication side (on the upper side in the figure), respectively. As a result, at the output terminals 4a and 4b, the current output representing the multiplication result of the inputs for the two systems appears.

Figure 9:
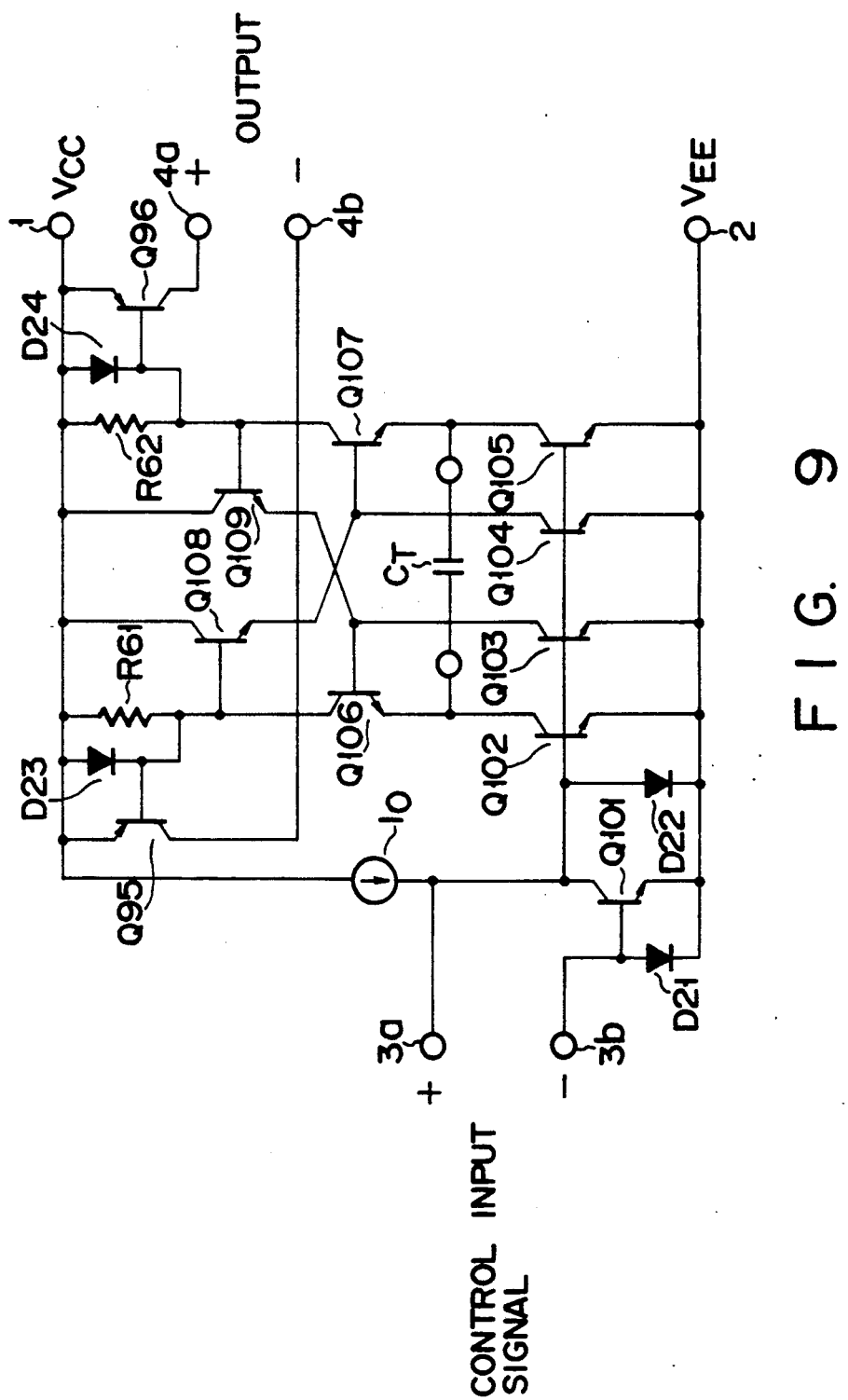
FIG. 9 is a circuit diagram for an emitter-coupled multivibrator cell as an example of an analog circuit cell used in a custom integrated circuit according to an embodiment of the present invention.

FIG. 9 shows a configuration of an emitter-coupled multivibrator cell having a current-sink input terminal and a current-source output terminal. The input terminals 3a and 3b are supplied with the control input signal. Between the input terminal 3a and the power supply terminal 1 to which the supply voltage $V_{CC}$ is applied, a current source $I_O$ is connected. The input terminal 3b is connected to the base of n-p-n transistor Q101 and the anode of diode D21. The transistor Q101 has its collector connected to the input terminal 3a, the anode of diode D22, and the bases of n-p-n transistors Q102 through Q105, and its emitter to the power supply terminal 2 to which the supply voltage $V_{EE}$ is applied. The cathodes of diodes D21 and D22 and the emitters of transistors Q102 through Q105 are connected to the power supply terminal 2. The collector of transistor Q102 is connected to the emitter of n-p-n transistor Q106, while the collector of transistor Q103 is connected to the base of transistor Q106. The collector of transistor Q105 is connected to the emitter of n-p-n transistor Q107, while the collector of transistor Q104 is connected to the base of transistor Q107. A capacitor CT is externally connected between the emitters of transistors Q106 and Q107. The n-p-n transistor Q108 has its collector connected to the power supply terminal 1, its emitter to the base of transistor Q107, and its base to the collector of transistor Q106. The n-p-n transistor Q109 has its collector connected to the power supply terminal 1, its emitter to the base of transistor Q106, and its base to the collector of transistor Q107. Between the base of transistor Q108 and the power supply terminal 1, resistor R61 and diode D23 are connected in parallel, whereas between the base of transistor Q109 and the power supply terminal 1, resistor R62 and diode D24 are connected in parallel. The p-n-p transistor Q95 has its emitter connected to the power supply terminal 1, its base to the cathode of diode D23, and its collector to the output terminal 4b. The p-n-p transistor Q96 has its emitter connected to the power supply terminal 1, its base to the cathode of diode D24, and its collector to the output terminal 4a.

The emitter-coupled multivibrator cell is a current-controlled oscillator circuit, whose input is a control input signal for controlling frequency. The oscillation frequency is determined by the relationship between the capacity of the capacitor $C_T$ and the operating current. The differential pulse current output is obtained at the output terminals 4a and 4b.

Figure 10:
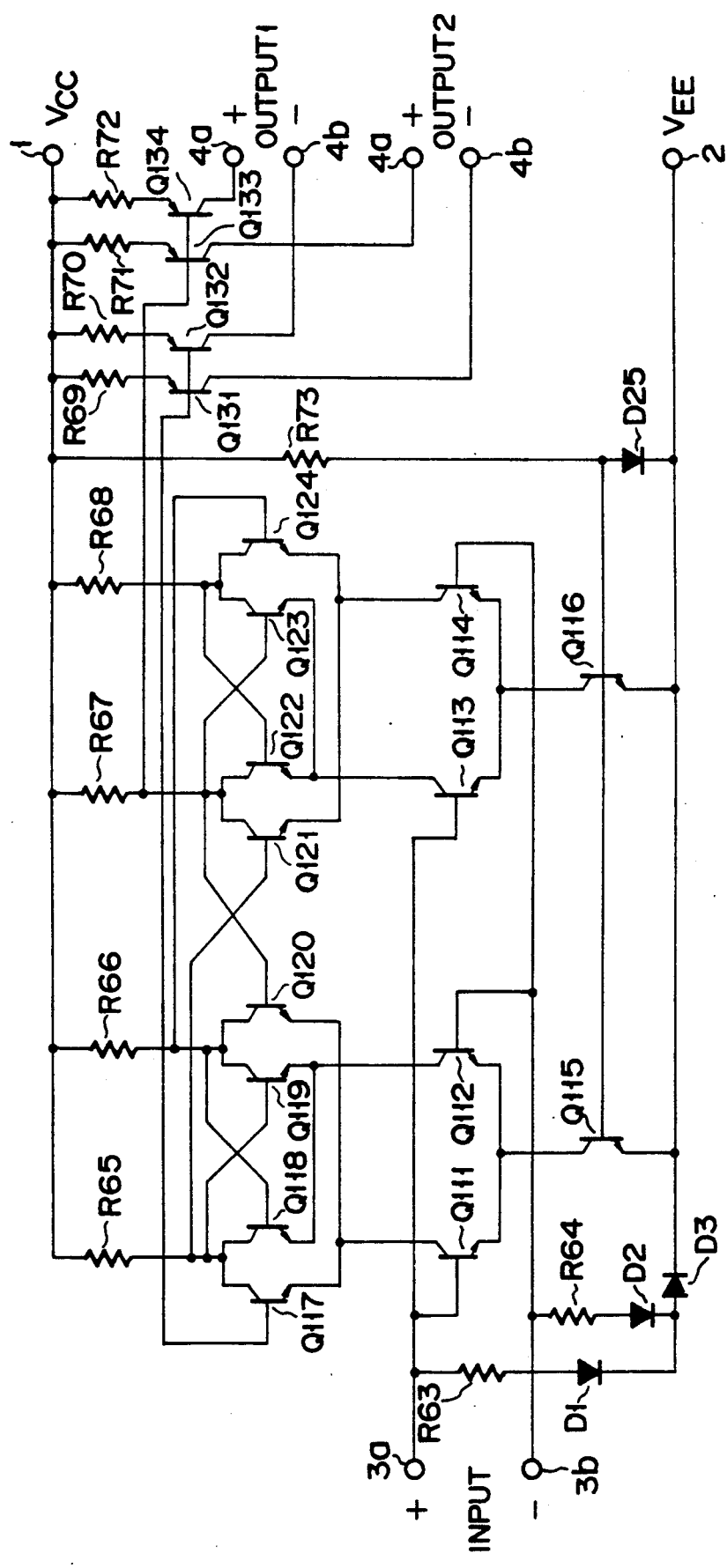
FIG. 10 is a circuit diagram for an ECL frequency divider cell as an example of an analog circuit cell used in a custom integrated circuit according to an embodiment of the present invention.
Figure 11:
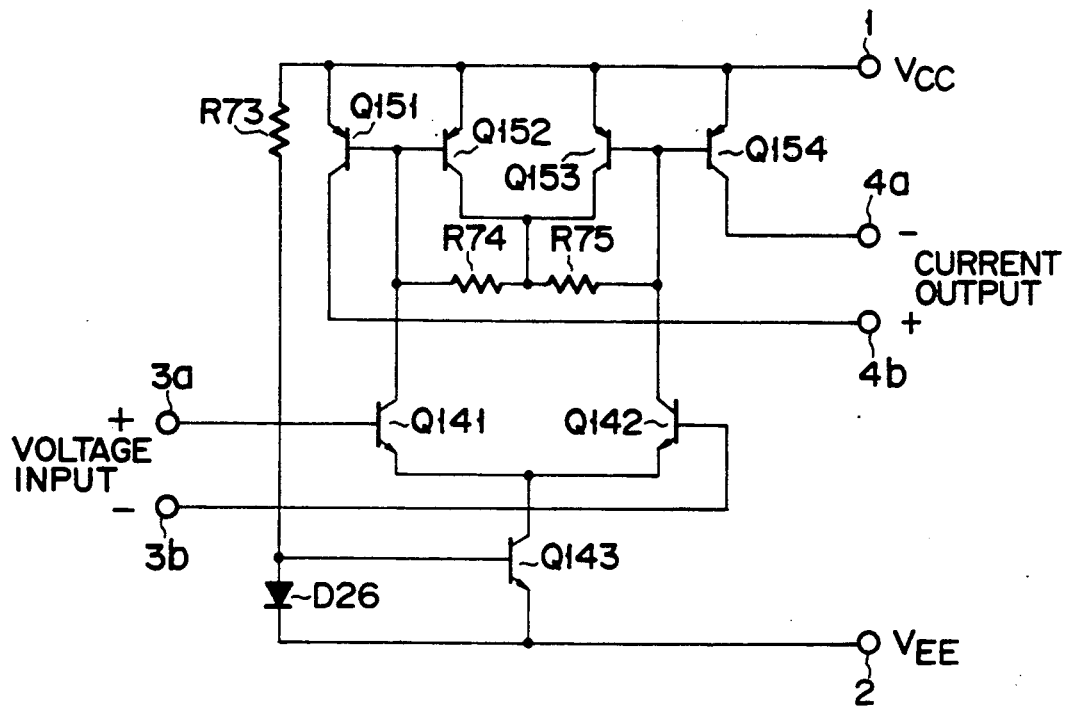
FIG. 11 is a circuit diagram for a Gm amplifier cell as an example of an analog circuit cell used in a custom integrated circuit according to an embodiment of the present invention.

FIG. 10 illustrates an arrangement of an ECL (emitter-coupled logic) frequency divider cell having the current-sink input terminal and the current-source output terminal. The ECL frequency divider cell is constructed by adding a current folded circuit, which is composed of diodes D1 through D3, between the power supply $V_{EE}$ and the input terminals 3a and 3b of an ordinary voltage-input ECL frequency divider cell. That is, the input terminal 3a is connected to one end of resistor R63 and the bases of n-p-n transistors Q111 and Q113, while the input terminal 3b is connected to one end of resistor R64 and the bases of n-p-n transistors Q112 and Q114. The other end of resistor R63 is connected to the anode of diode D1, while the other end of resistor R64 is connected to the anode of diode D2. The cathodes of diodes D1 and D2 are connected to the anode of diode D3, the cathode of which is connected to the power supply terminal 2 to which the supply voltage $V_{EE}$ is applied. The emitters of transistors Q111 and Q112 are connected together, and the connecting point is connected to the collector of n-p-n transistor Q115. The emitters of transistors Q113 and Q114 are connected together, and the connecting point is connected to the collector of n-p-n transistor Q116. The emitters of transistors Q115 and Q116 are connected to the power supply terminal 2. The collector of transistor Q111 is connected to the emitters of n-p-n transistors Q117 and Q120, while the collector of transistor Q112 is connected to the emitters of n-p-n transistors Q118 and Q119. The collector of transistor Q113 is connected to the emitters of n-p-n transistors Q122 and Q123, while the collector of transistor Q114 is connected to the emitters of n-p-n transistors Q121 and Q124. The collectors of transistors Q117 and Q118 are connected together; similarly the collectors of transistors Q119 and Q120, the collectors of transistors Q121 and Q122, and the collectors of transistors Q123 and Q124 are each connected together. The collector connecting point of transistors Q117 and Q118 is connected to the bases of transistors Q119 and Q121, and between the resulting connecting point and the power supply terminal 1, resistor R65 is connected. The collector connecting point of transistors Q119 and Q120 is connected to the bases of transistors Q118 and Q124, and between the resulting connecting point and the power supply terminal 1, resistor R66 is connected. The collector connecting point of transistors Q121 and Q122 is connected to the bases of transistors Q120 and Q123, and between the resulting connecting point and the power supply terminal 1, resistor R67 is connected. The collector connecting point of transistors Q123 and Q124 is connected to the base of transistors Q122, and between the resulting connecting point and the power supply terminal 1, resistor R68 is connected. The base of transistor Q117 is connected to the bases of p-n-p transistors Q131 and Q132 and the collector connecting point of transistors Q121 and Q122 is connected to the bases of p-n-p transistors Q133 and Q134. Resistors R69 through R72 are connected between the power supply terminal 1 and the emitters of transistors Q131 through Q134, respectively. The collector of transistor Q134 is connected to the output terminal 4a to output a first output signal via terminal 4a and the collector of transistor Q132 to the output terminal 4b to output the first output signal via terminal 4b. The collector of transistor Q133 is connected to the output terminal 4a' to output a second output signal via terminal 4a' and the collector of transistor Q131 to the output terminal 4b' to output the second output signal via terminal 4b'. Between the power supply terminals 1 and 2, resistor R73 and diode D25 are connected in series, with the anode of diode D25 connected to the bases of transistors Q115 and Q116.

The ECL frequency divider cell halves the frequency of the input signal supplied to the input terminals 3a and 3b and produces the frequency-divided current output at the output terminals 4a and 4b, and 4a' and 4b'.

Many of ordinary systems require a high impedance input terminal and a voltage input signal. In such systems, the front end section is an interface cell used in the first stage in a combination of a plurality of analog cells, a configuration of the interface cell being shown in FIG. 11. The cell has a high-impedance voltage input terminal and a high-impedance current out-put terminal and is of the Gm amplification type where the input is in the voltage mode and the output is in the current mode. The Gm amplification type cell is composed of n-p-n transistors Q141 through Q143, p-n-p transistors Q151 through Q154, diode D26, and resistors R73 through R75. The input terminal 3a is connected to the base of transistor Q141, and the input terminal 3b to the base of transistor Q142. The emitters of transistors Q141 and Q142 are connected to one another, and the emitter connecting point is connected to the collector of transistor Q143. A resistor R73 is connected between the power supply terminal 1 to which the supply voltage $V_{CC}$ is applied and the base of transistor Q143, the emitter of which is connected to the power supply terminal 2 to which the supply voltage $V_{EE}$ is applied. The base and emitter of transistor Q143 are connected to the anode and cathode of diode D26, respectively. The collector of transistor Q141 is connected to the bases of p-n-p transistors Q151 and Q152, and the collector of transistor Q142 to the bases of p-n-p transistors Q153 and Q154. Between the collectors of transistors Q141 and Q142, resistors R74 and R75 are connected in series. The connecting point of resistors R74 and R75 is connected to the collectors of transistors Q152 and Q153 The emitters of transistors Q151 through Q154 are connected to the power supply terminal 1. The collector of transistor Q154 is connected to the output terminal 4a, and the collector of transistor Q151 to the output terminal 4b.

The Gm amplification cell receives the input with an ordinary differential amplifier and, for the output section, employs a current mirror circuit having a gain similar to that of the amplifier cell of FIG. 3.

Figure 12:
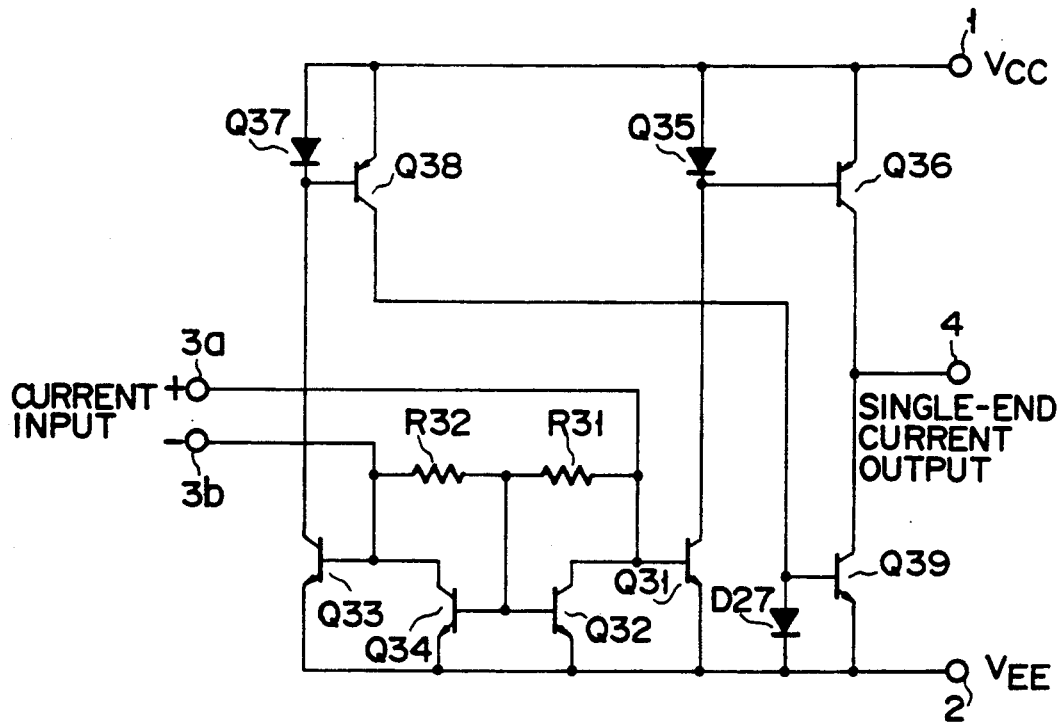
FIG. 12 is a circuit diagram for a single-end output current amplifier cell as an example of an analog circuit cell used in a custom integrated circuit according to an embodiment of the present invention.

FIG. 12 illustrates an arrangement of an interface cell used in the final stage in a combination of a plurality of analog circuit cells such as the rear end of the system. The cell has a low-impedance current input terminal and a high-impedance single-end current output terminal and is of the single-end current amplification type where the input and output are in the current mode. This single-end current amplification cell is the same as the amplifier cell of FIG. 4 except that its output section is modified. That is, an n-p-n transistor Q39 and single-end voltage output terminal 4 are added to the circuit of FIG. 4. The same parts in FIGS. 12 and 4 are indicated by the same reference characters and their detailed explanation will be omitted. The output terminal 4 is connected to the collectors of transistors Q36 and Q39. The base of transistor Q39 is connected to the collector of transistor Q3 and the anode of diode D27. The emitter of transistor Q39 and the cathode of diode D27 are connected to the power supply terminal 2.

The single-end current amplification cell has the function of converting the differential current input into the single-end current output. The single-end voltage output can be obtained by connecting a load resistor between the single-end current output terminal 4 and any voltage point in the range of the supply voltages $V_{CC}$ and $V_{EE}$. A voltage output type cell may be obtained by placing the load resistor within the cell and adding an emitter follower.

FIG. 13 shows a PLL (a phase-locked loop) multiplication circuit composed of a cascade connection of a plurality of analog circuit cells as an example of a system constructed by combining parts of various cells described above. The PLL multiplication circuit is constructed by connecting in cascade the Gm amplification cell 12 of FIG. 11, the multiplier cell 13 of FIG. 8, a loop filter 14 composed of resistors R81 through R83 and a capacitor C7, the emitter-coupled multivibrator cell 15 of FIG. 9, and the ECL frequency divider cell 16 of FIG. 10.

The voltage input signal is converted into current at the Gm amplification cell 12 and then supplied to the first input terminals of the subsequent multiplier cell 13. The second output signal from the ECL frequency divider cell 16 is supplied to the second input terminals of the multiplier cell 13. The output of the multiplier cell 13 is supplied via the loop filter 14 to the emitter-coupled multivibrator cell 15 as the control input signal. The output of the emitter-coupled multivibrator cell 15 is supplied to the ECL frequency divider cell 16 to complete the PLL. The oscillation output of the emitter-coupled multivibrator 15 is synchronized in phase with the frequency twice as large as that of the input signal. The first output signal of the ECL frequency divider cell 16 is supplied as the output signal of the PLL multiplication circuit.

Figure 14:
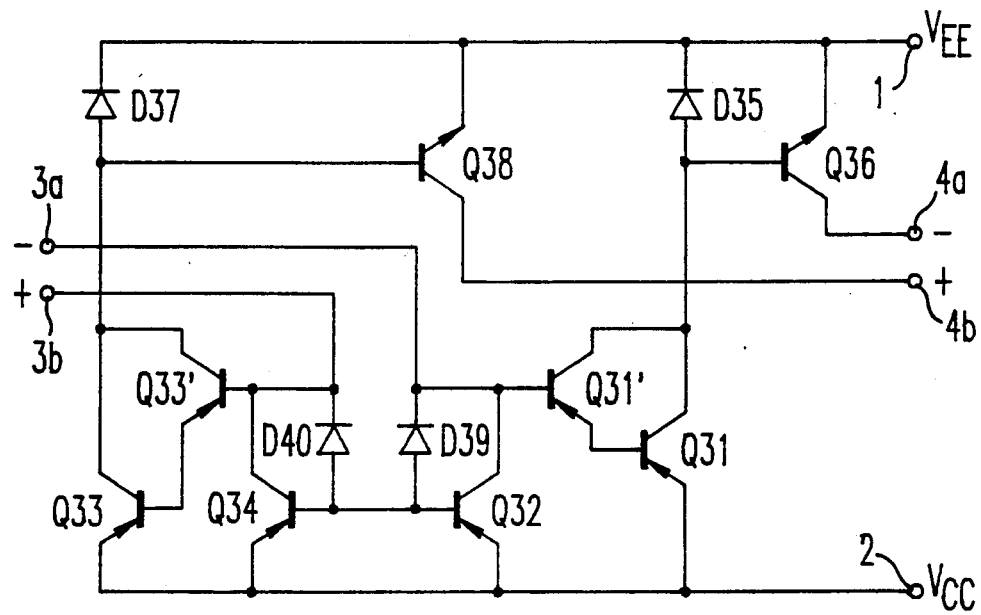
FIG. 14 is a circuit diagram showing an embodiment of the present invention having the input terminal as a current-source terminal and the output terminal as a current-sink terminal.
Figure 15:
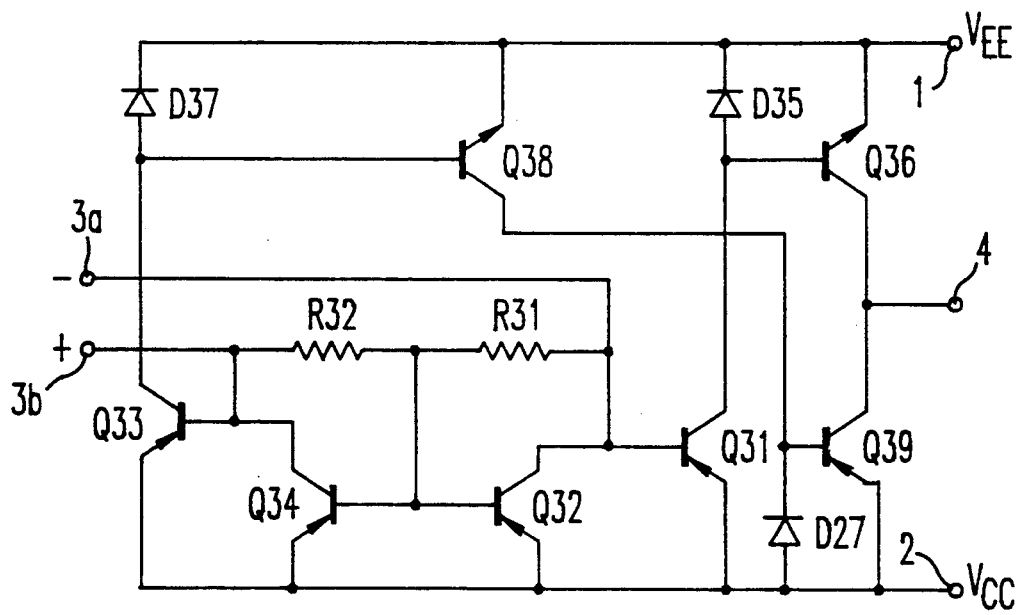
FIG. 15 shows a single-end analog circuit cell having a current-source as the input terminal and a current-sink as the output terminal.

A combination of a plurality of analog circuit cells is not restricted to the aforementioned cascade connection. For example, parallel connection of more than two cells with the same input conditions may be possible. Even for two or more cells having different input conditions, simple circuit modifications may allow parallel connection of them. Although in the arrangements described so far, cells with the current-sink input terminal and the current-source output terminal are used, these cells may be modified into cells with the current-source input terminal and the current-sink output terminal by replacing the n-p-n transistors with the p-n-p transistors and the power supply $V_{CC}$ terminal with the power supply $V_{EE}$ terminal as shown in FIG. 14. FIG. 15 shows an analogous circuit cell to the single-end circuit of FIG. 12, but in which the input terminal acts as a current-source and the output terminal acts as a current-sink.

As described above, the present invention is constructed by combining a plurality of analog circuit cells including those with the function of operating in the current mode, the analog circuit cells having the current-sink input terminal and the current-source out-put terminal (or the current-source input terminal and the current-sink output terminal). Therefore, the following features may be obtained:

(a) The supply voltage of the circuit cell can be set freely. In this case, the minimum supply voltage is determined by the circuit configuration and the maximum supply voltage by the withstand voltage of elements.

(b) The interface of analog circuit cells with each other is simple. It is not necessary to take into account the voltage at the connection, facilitating direct connection.

(c) The high versatility of cells enables construction of various systems using a minimum number of cells.

(d) The transmission of signal in the differential current mode makes the system less susceptible to power supply ripples or external noises.

What is claimed is:

1. A custom semiconductor integrated circuit having an arrangement which is constructed by connecting in cascade a plurality of analog circuit cells, said analog circuit cells having functions different from each other, comprising:

a first analog circuit cell formed as a first-stage of the cascade connected analog circuit cells, and constituting an input interface for receiving a first signal;

a second analog circuit cell formed as a final-stage of the cascade connected analog circuit cells, and constituting an output interface for outputting a second signal; and a third analog circuit cell, connected between said first and second analog circuit cells, having a current-sink input terminal and a current-source output terminal in order to thereby facilitate impedance matching between respective input and output terminals of said cascade connected analog circuit cells, said third analog circuit cell operating in a current mode and performing differential input signal processing, wherein said first analog circuit cell formed as said first-stage of said cascade connected analog circuit cells is connected to said third analog circuit cell at said current-sink input terminal and said second analog circuit cell formed as said final-stage of said cascade connected analog circuit cells is connected to said third analog circuit cell at said current-source output terminal.

2. A custom semiconductor integrated circuit according to claim 1, wherein the first-stage analog circuit cell in said plurality of analog circuit cells is a Gm amplification analog circuit cell having a voltage input terminal of high impedance and a current output terminal of high impedance.

3. A custom semiconductor integrated circuit according to claim 1, wherein the second analog circuit cell in said plurality of analog circuit cells is a single-end analog circuit cell having a current input terminal of low impedance and a single-end output terminal.

4. A custom semiconductor integrated circuit having an arrangement which is constructed by connecting in cascade a plurality of analog circuit cells, said analog circuit cells having functions different from each other, comprising:

a first analog circuit cell formed as a first-stage of the cascade connected analog circuit cells, and constituting an input interface for receiving a first signal;

a second analog circuit cell formed as final-stage of the cascade connected analog circuit cells, and constituting an output interface for outputting a second signal; and a third analog circuit cell connected between said first and second analog circuit cells, having a current-source input terminal and a current-sink output terminal in order to thereby facilitate impedance matching between the respective input and output terminals of said cascade connected analog circuit cells, said third analog circuit cell operating in a current mode and performing differential input signal processing, wherein said first analog circuit cell formed as said first-stage of said cascade connected analog circuit cells is connected to said third analog circuit cell at said current-source input terminal and said second analog circuit cell formed as said final-stage of said cascade connected analog circuit cells is connected to said third analog circuit cell at said current-sink output terminal.

5. A custom semiconductor integrated circuit according to claim 4, wherein the first analog circuit cell in said plurality of analog circuit cells is a Gm amplification analog circuit cell having a voltage input terminal of high impedance and a current output terminal of high impedance.

6. A custom semiconductor integrated circuit according to claim 4, wherein the second analog circuit cell in said plurality of analog circuit cells is a single-end analog circuit cell having a current input terminal of low impedance and a single-end output terminal.

* * * * *